United States Patent
Kohmura et al.

(10) Patent No.: US 10,185,217 B2
(45) Date of Patent: Jan. 22, 2019

(54) PELLICLE FRAME, PELLICLE AND METHOD OF MANUFACTURING THE SAME, ORIGINAL PLATE FOR EXPOSURE AND METHOD OF MANUFACTURING THE SAME, EXPOSURE DEVICE, AND METHOD OF MANUFACTURING SEMICONDUCTOR DEVICE

(71) Applicant: Mitsui Chemicals, Inc., Minato-ku, Tokyo (JP)

(72) Inventors: Kazuo Kohmura, Chiba (JP); Yosuke Ono, Sodegaura (JP); Daiki Taneichi, Chiba (JP); Yasuyuki Sato, Ibara (JP); Toshiaki Hirota, Ibara (JP)

(73) Assignee: MITSUI CHEMICALS, INC., Minato-Ku, Tokyo (JP)

( * ) Notice: Subject to any disclaimer, the term of this patent is extended or adjusted under 35 U.S.C. 154(b) by 45 days.

(21) Appl. No.: 15/304,996

(22) PCT Filed: Apr. 27, 2015

(86) PCT No.: PCT/JP2015/062742
§ 371 (c)(1),
(2) Date: Oct. 18, 2016

(87) PCT Pub. No.: WO2015/166927
PCT Pub. Date: Nov. 5, 2015

(65) Prior Publication Data
US 2017/0192349 A1    Jul. 6, 2017

(30) Foreign Application Priority Data
May 2, 2014  (JP) .................................. 2014-095425

(51) Int. Cl.
| | |
|---|---|
| G03F 1/22 | (2012.01) |
| G03F 1/62 | (2012.01) |
| G03F 1/64 | (2012.01) |
| G03F 7/20 | (2006.01) |
| H01L 21/673 | (2006.01) |

(52) U.S. Cl.
CPC .................. *G03F 1/64* (2013.01); *G03F 1/22* (2013.01); *G03F 1/62* (2013.01); *G03F 7/2004* (2013.01); *H01L 21/67359* (2013.01)

(58) Field of Classification Search
CPC . G03F 1/62; G03F 1/22; G03F 7/2004; G03F 1/64; H01L 21/67359
USPC .......................................................... 430/5
See application file for complete search history.

(56) References Cited

U.S. PATENT DOCUMENTS

| | | | |
|---|---|---|---|
| 5,793,836 | A | 8/1998 | Maldonado et al. |
| 6,055,040 | A | 4/2000 | Sego |
| 2012/0183757 | A1 | 7/2012 | Akiyama et al. |
| 2013/0088699 | A1 | 4/2013 | Yakunin et al. |
| 2014/0160455 | A1 | 6/2014 | Yakunin et al. |

FOREIGN PATENT DOCUMENTS

| | | |
|---|---|---|
| JP | H-10-092743 A | 4/1998 |
| JP | 2005-43895 A | 2/2005 |
| JP | 2009-116284 | 5/2009 |
| JP | 2009-169380 A | 7/2009 |
| JP | 2010-256434 A | 11/2010 |
| JP | 2012-151158 A | 8/2012 |
| JP | 2013-534727 A | 9/2013 |
| KR | 10-2011-0028978 A | 3/2011 |
| WO | WO 2011/160861 A1 | 12/2011 |

OTHER PUBLICATIONS

International Search Report (PCT/ISA/210) dated Aug. 11, 2015, by the Japanese Patent Office as the International Searching Authority for International Application No. PCT/JP2015/062742.
Written Opinion (PCT/ISA/237) dated Aug. 11, 2015, by the Japanese Patent Office as the International Searching Authority for International Application No. PCT/JP2015/062742.
Notice for Submission of Opinions issued by the Korean Intellectual Property Office in corresponding Korean Patent Application No. 10-2016-7029221 dated Sep. 11, 2017 (13 pages including partial English translation).

*Primary Examiner* — Christopher G Young
(74) *Attorney, Agent, or Firm* — Buchanan, Ingersoll & Rooney PC

(57) ABSTRACT

A pellicle frame containing a frame body, the frame body having a groove formed in one end surface of the frame body, the one end surface being an end surface in a thickness direction of the frame body that is located at a side configured to support a pellicle membrane, and a through-hole that penetrates through a portion between an outer circumferential surface of the frame body and a wall surface of the groove formed in the one end surface.

21 Claims, 9 Drawing Sheets

PELLICLE FRAME, PELLICLE AND METHOD OF MANUFACTURING THE SAME, ORIGINAL PLATE FOR EXPOSURE AND METHOD OF MANUFACTURING THE SAME, EXPOSURE DEVICE, AND METHOD OF MANUFACTURING SEMICONDUCTOR DEVICE

TECHNICAL FIELD

The present invention relates to a pellicle frame, a pellicle and a method of manufacturing the same, an original plate for exposure and a method of manufacturing the same, an exposure device, and a method of manufacturing semiconductor devices.

BACKGROUND ART

High integration and miniaturization of semiconductor devices are accelerating every year.

For example, currently, patterns with a line width of approximately 45 nm are being formed by excimer exposure. However, in recent years, with the advance in the miniaturization of semiconductor devices, there is a demand to form patterns with a line width of 32 nm or less. Such fine processing is difficult to be handled by the conventional excimer exposure. Therefore, the use of extreme ultra violet (EUV) light having a shorter wavelength as the exposure light is being under consideration.

EUV light has a property of being easily absorbed by any substance.

Therefore, in photolithography (hereinafter also referred to as "EUV lithography") which uses EUV light as exposure light, exposure is performed using a catoptric system. Specifically, EUV light is reflected from an original plate having an exposure pattern reflected thereon and a resist is exposed by the EUV light as reflection light. In this case, when foreign particles adhere to the original plate, since EUV light is absorbed or scattered by the foreign particles, a desired pattern may not be formed on the original plate.

Therefore, a method of protecting the EUV irradiation surface of the original plate with a pellicle has been taken into consideration.

The pellicle is configured to include a pellicle membrane for protecting a EUV irradiation surface of an original plate and a pellicle frame (frame body) that supports the pellicle film.

The pellicle membrane used in EUV lithography is required to have high transmittance with respect to EUV light, and resistance against decomposition and deformation in the event of irradiation of EUV light. As a pellicle membrane that satisfies such requirements, a crystalline silicon film such as a monocrystalline silicon film (for example, see Documents 1 and 2 below), an aluminum nitride film layered on a metal mesh (for example, see Document 3), a graphene film (for example, see Document 4), and the like are proposed.

Document 1: Japanese Patent Application Laid-Open (JP-A) No. 2010-256434
Document 2: Japanese Patent Application Laid-Open (JP-A) No. 2009-116284
Document 3: Japanese Patent Application Laid-Open (JP-A) No. 2005-43895
Document 4: International Publication No. 2011/160861

SUMMARY OF INVENTION

Technical Problem

However, in general, a pellicle membrane has such a property that the pellicle membrane is extremely easily broken. Thus, handling of the pellicle membrane requires careful attention. Among pellicle membranes, pellicle membranes (for example, the pellicle membranes disclosed in Documents 1 to 4) that contain an inorganic material are not only easily broken and are rarely self-supporting but also cause scratches and generate particles with mechanical contact. Thus, handling of pellicle membranes (for example, the pellicle membranes disclosed in Documents 1 to 4) that contain an inorganic material requires more careful attention.

Moreover, with the advance in the miniaturization of semiconductor devices, more careful attention is required to prevent foreign particles from adhering to the members including the pellicle membrane, the pellicle frame, and the original plate.

In this respect, a method of fixing the pellicle frame and the other member (for example, the pellicle membrane, the other pellicle frame, the original plate, or the like) so that the front and rear surfaces of each of the pellicle frame and the other member do not come in contact with a device, a jig, a hand, or the like has been taken into consideration.

Here, the "front surface" of the pellicle frame means one of one end surface or the other end surface in the thickness direction of the pellicle frame, and the "rear surface" means the other of one end surface or the other end surface in the thickness direction of the pellicle frame.

Moreover, the "front surface" and the "rear surface" of the pellicle membrane mean one membrane surface and the other membrane surface.

A "front surface" of the original plate means a light irradiation surface and a "rear surface" of the original plate means a surface opposite the light irradiation surface.

The invention has been made in view of the foregoing and aims to achieve the following objects.

That is, an object of the invention is to provide a pellicle frame capable of fixing a pellicle frame and a pellicle membrane directly or with another member (for example, another pellicle frame) interposed without making any contact with front and rear surfaces of each of the pellicle frame and the pellicle membrane when manufacturing a pellicle by fixing the pellicle frame and the pellicle membrane, a pellicle having the pellicle frame, an original plate for exposure having the pellicle, an exposure device which uses the original plate for exposure, and a method of manufacturing a semiconductor device which uses the original plate for exposure.

Another object of the invention is to provide a method of manufacturing a pellicle capable of manufacturing a pellicle without making any contact with front and rear surfaces of each of the pellicle frame and the pellicle membrane, and a method of manufacturing an original plate for exposure capable of manufacturing the original plate for exposure without making any contact with front and rear surfaces of each of the pellicle and the original plate.

Solution to Problem

The followings are specific means for solving the problems.

<1> A pellicle frame containing a frame body, the frame body having a groove formed in one end surface of the frame body, the one end surface being an end surface in a thickness direction of the frame body that is located at a side configured to support a pellicle membrane, and a through-hole that penetrates through a portion between an outer circumferential surface of the frame body and a wall surface of the groove formed in the one end surface.

<2> The pellicle frame according to <1>, wherein the frame body further has a groove formed in the other end surface in the thickness direction of the frame body, and a through-hole that penetrates through a portion between the outer circumferential surface and a wall surface of the groove formed in the other end surface.

<3> The pellicle frame according to <1> or <2>, further containing an adhesive layer that contacts the one end surface.

<4> A pellicle including:
a first pellicle frame that is the pellicle frame according to any one of <1> to <3>; and a pellicle membrane supported at a side of the frame body of the first pellicle frame at which the one end surface is located.

<5> The pellicle according to <4>, wherein the pellicle membrane contains at least one inorganic material selected from the group consisting of crystalline silicon, diamond-like carbon, graphite, amorphous carbon, graphene, silicon carbides, silicon nitrides, and aluminum nitrides.

<6> The pellicle according to <4> or <5>, wherein the pellicle membrane has a thickness of from 10 nm to 200 nm.

<7> The pellicle according to any one of <4> to <6>, further containing a second pellicle frame that contacts the pellicle membrane, the second pellicle frame being provided between the first pellicle frame and the pellicle membrane.

<8> The pellicle according to <7>, wherein the pellicle contains a composite member, the composite member including a crystalline silicon film as the pellicle membrane and a frame-shaped silicon substrate as the second pellicle frame.

<9> A method of manufacturing a pellicle, containing:
an arrangement process of arranging the pellicle frame according to any one of <1> to <3> and a pellicle membrane such that the one end surface of the frame body and the pellicle membrane face each other; and
a fixing process of fixing the pellicle frame and the pellicle membrane by reducing pressure inside the groove formed in the one end surface through the through-hole that penetrates through the portion between the outer circumferential surface and the wall surface of the groove formed in the one end surface.

<10> The method of manufacturing a pellicle according to <9>, wherein in the fixing process, the reducing of the pressure is performed in a state in which the pellicle frame and the pellicle membrane are disposed in a pressurized atmosphere.

<11> An original plate for exposure, containing the pellicle according to any one of <4> to <8>, and an original plate disposed on a first pellicle frame side of the pellicle.

<12> The exposure original plate according to <11>, wherein the frame body of the first pellicle frame further has a groove formed in the other end surface of the frame body, the other end surface being in the thickness direction, and a through-hole that penetrates through a portion between the outer circumferential surface and a wall surface of the groove formed in the other end surface.

<13> A method of manufacturing an original plate for exposure, containing:
an arrangement process of arranging the pellicle according to any one of <4> to <8> and an original plate, wherein the frame body of the first pellicle frame further has a groove formed in the other end surface in the thickness direction of the frame body, and a through-hole that penetrates through a portion between the outer circumferential surface and a wall surface of the groove fruited in the other end surface, and the arranging is performed such that the other end surface and the original plate face each other, and
a fixing process of fixing the pellicle and the original plate by reducing pressure inside the groove formed in the other end surface through the through-hole that penetrates through the portion between the outer circumferential surface and the wall surface of the groove formed in the other end surface.

<14> The method of manufacturing an original plate for exposure according to <13>, wherein the reducing of pressure in the fixing process is performed in a state in which the pellicle and the original plate are disposed in a pressurized atmosphere.

<15> An exposure device including the exposure original plate according to <11> or <12>.

<16> An exposure device including:
a light source configured to emit exposure light;
the original plate for exposure according to <11> or <12>; and
an optical system configured to guide the exposure light emitted from the light source toward the original plate for exposure, wherein the original plate for exposure is disposed such that the exposure light emitted from the light source passes through the pellicle membrane to irradiate the original plate.

<17> The exposure device according to <16>, wherein the exposure light is EUV light.

<18> A method of manufacturing a semiconductor device, containing:
a step of allowing exposure light emitted from a light source to pass through the pellicle membrane of the original plate for exposure according to <11> or <12>, irradiate the original plate and be reflected from the original plate; and
a step of allowing the exposure light reflected from the original plate to pass through the pellicle membrane and irradiate a sensitive substrate, thereby exposing the sensitive substrate in a pattern.

<19> The semiconductor device manufacturing method according to <18>, wherein the exposure light is EUV light.

Advantageous Effects of Invention

According to the invention, a pellicle frame capable of fixing a pellicle frame and a pellicle membrane directly or with another member interposed without making any contact with front and rear surfaces of each of the pellicle frame and the pellicle membrane when manufacturing a pellicle by fixing the pellicle frame and the pellicle membrane, a pellicle having the pellicle frame, an original plate for exposure having the pellicle, an exposure device which uses the original plate for exposure, and a method of manufacturing a semiconductor device which uses the original plate for exposure are provided.

Moreover, according to the invention, a method of manufacturing a pellicle capable of manufacturing a pellicle without making any contact with front and rear surfaces of each of the pellicle frame and the pellicle membrane, and a method of manufacturing an original plate for exposure capable of manufacturing the original plate for exposure without making any contact with front and rear surfaces of each of the pellicle and the original plate are provided.

DESCRIPTION OF EMBODIMENTS

Figure 1:
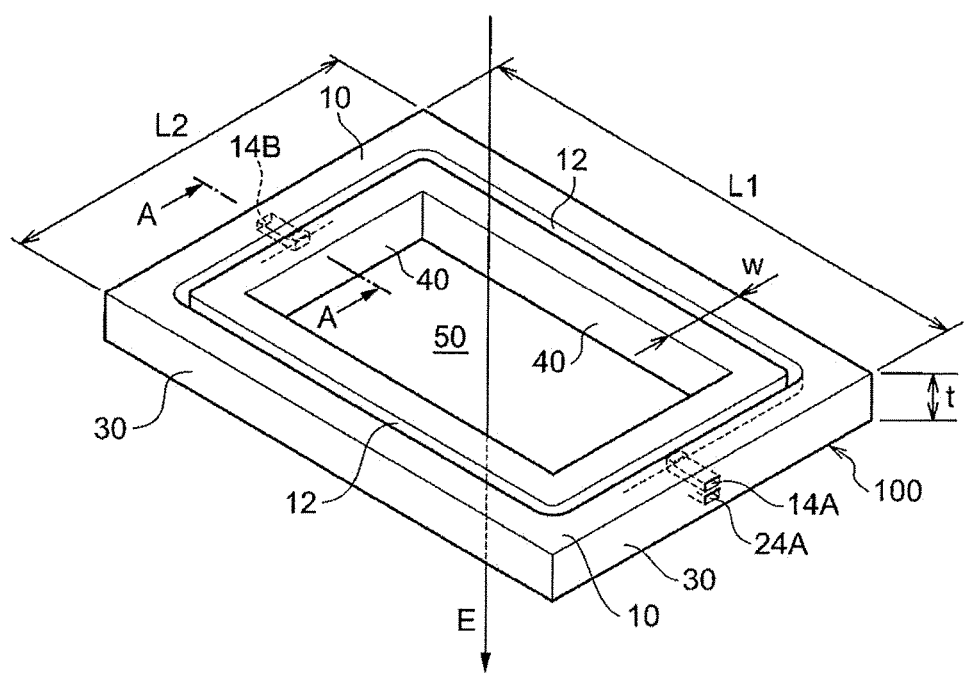
FIG. 1 is a schematic perspective view of a pellicle frame (frame body) which is an example of the present embodiment, when seen from a direction in which one end surface can be observed.

Hereinafter, an embodiment of the invention will be described by appropriately referring to the drawings. However, the invention is not limited to the specific embodiment illustrated in the drawings and the like. The same constituent elements in the respective drawings will be denoted by the same reference numerals and redundant description thereof will not be provided. Moreover, in the drawings, some hidden lines are not illustrated to make structures easily visible.

<Pellicle Frame>

A pellicle frame of the present embodiment includes a frame body, the frame body having a groove formed in one end surface of the frame body, the one end surface being an end surface in a thickness direction of the frame body that is located at a side configured to support a pellicle membrane, and a through-hole that penetrates through a portion between an outer circumferential surface of the frame body and a wall surface of the groove formed in the one end surface.

The pellicle frame of the present embodiment may further include an element (for example, an adhesive layer or the like described later) other than the frame body as necessary.

The pellicle frame and the frame body of the present embodiment are a frame-shaped member configured to support a pellicle membrane in the same manner as a general pellicle frame.

In the present specification, the "one end surface that is an end surface in a thickness direction of the frame body that is located at a side configured to support a pellicle membrane" indicates an end surface located at the side configured to support the pellicle membrane among the two end surfaces in the thickness direction of the frame body.

In the present embodiment, the through-hole penetrates through a portion between a part of the outer circumferential surface of the frame body and a part of the wall surface (a side surface or a bottom surface; the same hereinbelow) of the groove formed in the one end surface. Thus, by reducing pressure inside the groove through the through-hole in a state in which the one end surface of the frame body of the pellicle frame of the present embodiment is disposed to face the pellicle membrane directly or with another member (for example, another pellicle frame such as a second pellicle frame or the like described later; the same hereinbelow) interposed, pressing force can be applied between the pellicle frame and the pellicle membrane. Thus, the pellicle frame and the pellicle membrane can be fixed without making any contact with the front and rear surfaces of each of the pellicle frame and the pellicle membrane (with a device, a jig, a hand, or the like).

Therefore, according to the pellicle frame of the present embodiment, it is possible to obtain an advantage that when a pellicle is manufactured by fixing the pellicle frame and the pellicle membrane directly or with another member interposed, the pellicle frame and the pellicle membrane can be fixed without making any contact with the front and rear surfaces of each of the pellicle frame and the pellicle membrane.

In the present embodiment, the "pressing force" is a synonym of attractive force.

The use of the pellicle frame of the present embodiment enables to prevent foreign particles from adhering to the pellicle frame and the pellicle membrane, which may occur when something contacts the pellicle frame and the pellicle membrane.

Further, the use of the pellicle frame of the present embodiment enables to prevent destruction, scratches, particle generation, or the like of the pellicle membrane, which may occur when something contacts the pellicle membrane.

In recent years, with the advance in the miniaturization of semiconductor devices, the demand for suppressing adhesion of foreign particles to a pellicle and an original plate has been stronger.

Moreover, patterns with a line width of 32 nm or smaller are formed by EUV lithography, for example. The pellicle membrane that contains an inorganic material, used in the EUV lithography is easily broken and is rarely self-supporting, and is likely to cause scratches and generate particles with mechanical contact as compared to a pellicle membrane that contains an organic material. Thus, when a pellicle is manufactured using a pellicle membrane that contains an inorganic material, there is a strong demand for manufacturing the pellicle without making any contact with the membrane surface of the pellicle membrane. Here, "self-supporting" means the ability to maintain the membrane shape by itself.

According to the pellicle frame of the present embodiment, it is possible to satisfy these demands associated with the miniaturization of semiconductor devices.

Specifically, the pellicle frame of the present embodiment is suitable for manufacturing a pellicle including a pellicle membrane that contains an inorganic material among pellicles for lithography, which use exposure light having short wavelength (for example, EUV light, light having a shorter wavelength than the EUV light, or the like), in particular.

In the present embodiment, extreme ultra violet (EUV) light means light having a wavelength from 5 nm to 30 nm.

The wavelength of the EUV light is preferably from 5 nm to 13.5 nm.

In the present embodiment, the EUV light and light having a shorter wavelength than the EUV light will be sometimes collectively referred to as "EUV light or the like".

According to a preferred aspect of the pellicle frame of the present embodiment, the frame body may further have a groove formed in the other end surface of the frame body, the other end surface is in the thickness direction of the frame body, and a through-hole that penetrates through a portion between the outer circumferential surface and a wall surface of the groove formed in the other end surface.

The pellicle frame of this aspect is suitable for manufacturing an original plate for exposure in which the pellicle membrane is disposed at the side of the one end surface of the frame body and the original plate is disposed at the side of the other end surface. In manufacturing of the original plate for exposure, by using the pellicle frame of the aspect, it is possible to manufacture the pellicle without making any contact with the pellicle frame and the pellicle membrane and to manufacture the original plate for exposure without making any contact with the pellicle and the original plate.

The reason why the pellicle can be manufactured without making any contact with the pellicle frame and the pellicle membrane when the pellicle frame of the aspect is used is as described above. That is, this is because, by reducing pressure inside the groove formed in the one end surface through the through-hole that penetrates through the portion between the outer circumferential surface of the frame body of the pellicle frame and the wall surface of the groove formed in the one end surface, pressing force (that is, attractive force) can be applied between the pellicle frame and the pellicle membrane.

The reason why the original plate for exposure can be manufactured without making any contact with the pellicle and the original plate when the pellicle frame of the aspect is used is because, by reducing pressure inside the groove formed in the other end surface through the through-hole that penetrates through the portion between the outer circumferential surface of the frame body of the pellicle frame and the wall surface of the groove formed in the other end surface, pressing force (that is, attractive force) can be applied between the pellicle and the original plate.

(Example of Pellicle Frame)

Next, an example of the pellicle frame of the present embodiment will be described with reference to FIGS. 1 to 3. However, the pellicle frame of the present embodiment is not limited to this example.

Figure 2:
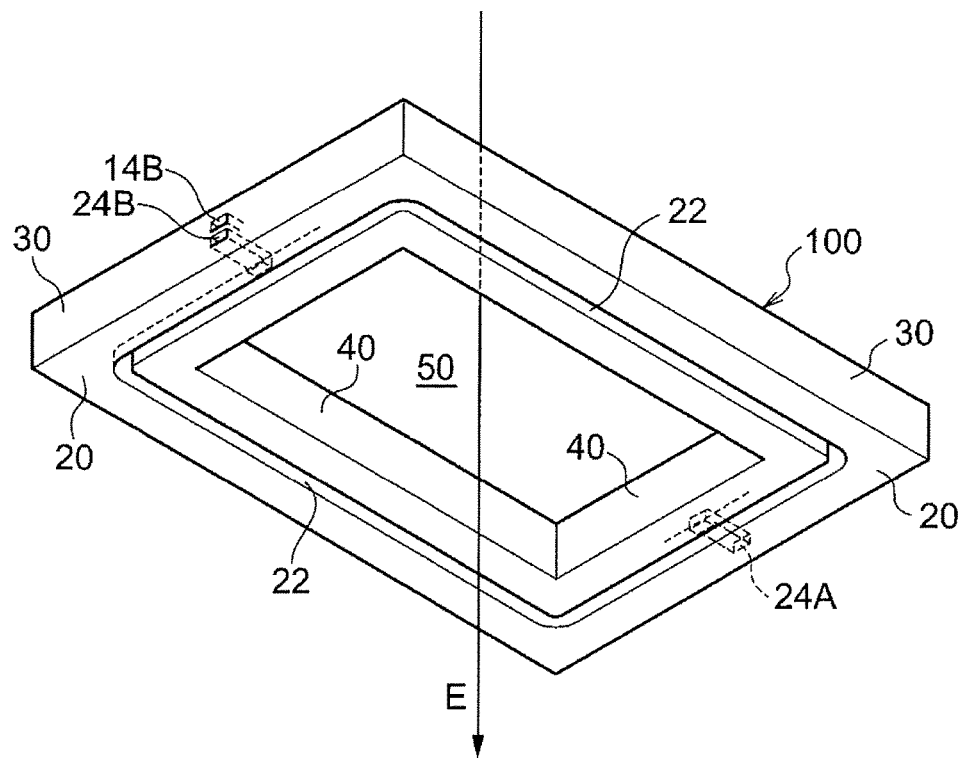
FIG. 2 is a schematic perspective view of the pellicle frame (frame body) according to an example of the present embodiment, when seen from a direction in which the other end surface can be observed.

FIG. 1 is a schematic perspective view seen from a direction in which one end surface 10 of a frame body 100 can be observed, and FIG. 2 is a schematic perspective view seen from a direction in which the other end surface 20 of the frame body 100 can be observed.

Figure 3:
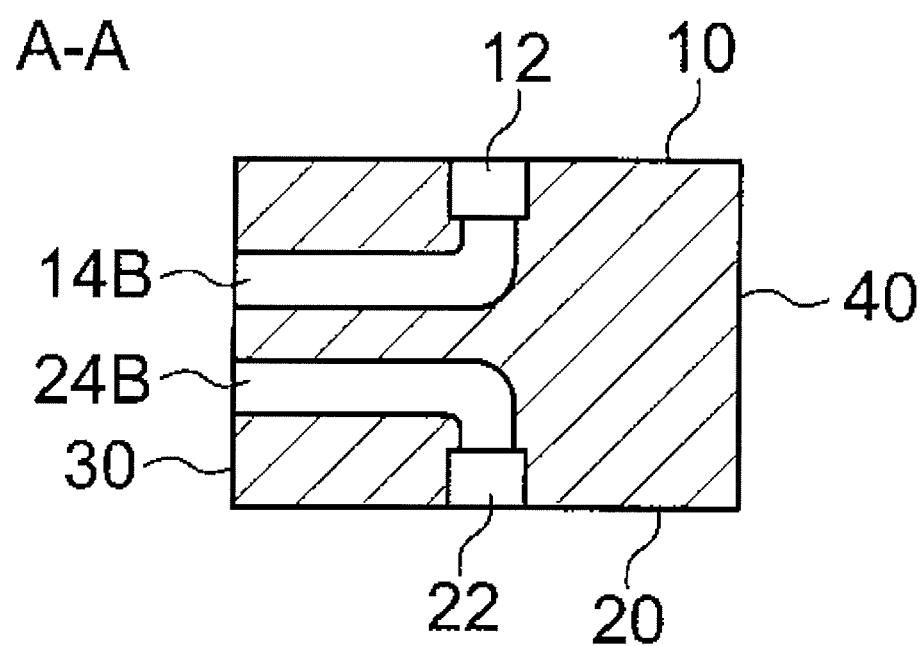
FIG. 3 is a cross-sectional view along line A-A in FIG. 1.

FIG. 3 is a cross-sectional view along line A-A in FIG. 1.

As illustrated in FIGS. 1 and 2, the frame body 100 (pellicle frame) has a rectangular frame shape. When the frame body 100 is used as one member of a pellicle, exposure light E passes through an opening 50 surrounded by the frame body 100.

The outer shape of the frame body 100 is defined by the one end surface 10 in the thickness direction of the frame body 100, the other end surface 20, an outer circumferential surface 30 including four surfaces, and an inner circumferential surface 40 including four surfaces.

The one end surface 10 of the frame body 100 is an end surface located at the side configured to dispose a pellicle membrane when an original plate for exposure is manufactured using the frame body 100. The other end surface 20 of the frame body 100 is an end surface located at the side configured to dispose the original plate when the original plate for exposure is manufactured using the frame body 100.

Although the shape in the thickness direction of the frame body 100 is a rectangular shape as described above, the shape seen in the thickness direction of the frame body of the present embodiment is not limited to the rectangular shape but may have another shape (for example, a trapezoidal shape, a shape having protrusions toward the outer side of the frame, or the like) other than the rectangular shape.

As illustrated in FIGS. 1 and 3, a groove 12 is formed in the one end surface 10.

In this embodiment, the shape of the groove 12 in the thickness direction of the frame body 100 is formed in an endless shape that circles along the shape of the frame body 100.

A variation of the shape of the groove in the thickness direction of the frame body will be described later.

The frame body 100 has through-holes 14A and 14B.

The through-holes 14A and 14B penetrate through a portion between the outer circumferential surface 30 and the bottom surface of the groove 12, respectively.

Here, the through-holes 14A and 14B may penetrate through a portion between the outer circumferential surface 30 and the side surface of the groove 12, respectively.

Moreover, any one of the through-holes 14A or 14B may be omitted. That is, in the frame body 100, although two through-holes (the through-holes 14A and 14B) are connected to one groove (the groove 12), the present embodiment is not limited to this aspect. In the present embodiment, at least one through-hole may be connected to one groove (the groove 12).

Moreover, as illustrated in FIGS. 2 and 3, a groove 22 is formed in the other end surface 20 on the opposite side of the one end surface 10.

In this embodiment, the shape of the groove 22 has an endless shape that circles along the shape of the frame body 100 when seen in the thickness direction similarly to the shape of the groove 12.

The frame body 100 has through-holes 24A and 24B.

The through-holes 24A and 24B penetrate through a portion between the outer circumferential surface 30 and the bottom surface of the groove 22, respectively.

A variation of the through-holes 24A and 24B is the same as the variation of the through-holes 14A and 14B.

The frame body 100 (pellicle frame) is suitable for fixing (supporting) the pellicle membrane to the side of the one end surface 10 to manufacture the pellicle.

When the pellicle membrane is fixed to the side of the one end surface 10, the groove 12 is formed in the one end surface 10 of the frame body 100, which is the surface facing the pellicle membrane, and the through-holes 14A and 14B are formed so as to be connected to the groove 12. Thus, when the pellicle membrane is fixed to the one end surface 10, by reducing pressure inside the groove 12 through the through-holes 14A and 14B (using an exhaust mechanism such as a vacuum pump, for example), it is possible to reduce the pressure between the frame body 100 and the pellicle membrane. With this reducing of the pressure, since pressing force (that is, attractive force) can be applied between the frame body 100 and the pellicle membrane, it is possible to fix the frame body 100 and the pellicle membrane without making any contact with the front and rear surfaces (that is, the one end surface 10 and the other end surface 20 of the frame body 100 and one membrane surface and the other membrane surface of the pellicle membrane) of each of the frame body 100 and the pellicle membrane.

The frame body 100 and the pellicle membrane may be fixed with an adhesive layer interposed. When the adhesive layer is used, since the frame body 100 and the pellicle membrane can be pressed against each other with the adhesive layer interposed, it is possible to fix the frame body 100 and the pellicle membrane reliably.

A specific aspect of a pellicle manufacturing method will be described later.

Moreover, the frame body 100 described above is suitable for fixing the original plate to the side of the other end surface 20 to manufacture the original plate for exposure.

When the original plate is fixed to the side of the other end surface 20, the groove 22 is formed in the other end surface 20 of the frame body 100, which is the surface facing the original plate, and the through-holes 24A and 24B are formed so as to be connected to the groove 22. Thus, when the original plate is fixed to the other end surface 20, by reducing pressure inside the groove 22 through the through-holes 24A and 24B (using an exhaust mechanism such as a vacuum pump, for example), it is possible to reduce the pressure between the frame body 100 and the original plate. With this reducing of the pressure, since pressing force can be applied between the frame body 100 and the original plate, it is possible to fix the frame body 100 and the original plate without making any contact with the front and rear surfaces (that is, the one end surface 10 and the other end surface 20 of the frame body 100 and the light irradiation surface of the original plate and a surface on the opposite side of the light irradiation surface) of each of the frame body 100 and the original plate. The fixing may be realized using an adhesive layer. After that, the pellicle membrane may be fixed to the side of the one end surface 10 of the frame body 100 (with an adhesive layer interposed as necessary).

Moreover, the frame body 100 described above is suitable for fixing the pellicle membrane to the frame body 100 to manufacture the pellicle and then fixing the obtained pellicle and the original plate to manufacture the original plate for exposure. In manufacturing of the original plate for exposure, as described above, it is possible to fix the frame body 100 and the pellicle membrane without making any contact with the front and rear surfaces of each of the frame body and the pellicle membrane to manufacture the pellicle and subsequently to fix the pellicle and the original plate without making any contact with the front and rear surfaces of each of the pellicle and the original plate to manufacture the original plate for exposure.

The frame body 100 may have the following dimensions, for example.

The length L1 in the longitudinal direction of the frame body 100 may be from 135 mm to 153 mm, for example, and preferably, from 140 mm to 152 mm, and more preferably, from 145 mm to 151 mm.

The length L2 in the lateral direction of the frame body 100 may be from 100 mm to 130 mm, for example, and preferably, from 105 mm to 125 mm, and more preferably, from 110 mm to 120 mm.

The length L1 in the longitudinal direction may be the same as the length L2 in the lateral direction. That is, the shape of the frame body 100 may be a square shape.

The frame width W of the frame body 100 may be from 1.0 mm to 5.0 mm, for example, and preferably, from 1.2 mm to 3.5 mm, and more preferably, from 1.5 mm to 2.5 mm. The four sides of the rectangular frame body 100 may have the same frame width and may have different frame widths.

The length in the longitudinal direction of the opening 50 (through-hole) surrounded by the frame body 100 may be from 130 mm to 152 mm, for example, and preferably, from 135 mm to 151 mm, and more preferably, from 140 mm to 150 mm.

Moreover, the width of the opening 50 may be from 95 mm to 130 mm, for example, and preferably, from 100 mm to 125 mm, and more preferably, from 105 mm to 120 mm.

The thickness t of the pellicle frame may be from 0.5 mm to 5.0 mm, for example, and preferably, from 0.5 mm to 3.0 mm, and more preferably, from 0.5 mm to 2.0 mm.

Moreover, although the width of the grooves 12 and 22 can be set appropriately by taking reduction of the pressure loss in the groove, the relation with the frame width of the frame body, and the like into consideration, the width of the groove may be from 10 μm to 1.0 mm, for example, and preferably from 50 μm to 700 μm, and more preferably, from 100 μm to 600 μm, and particularly preferably, from 200 μm to 500 μm.

Moreover, although the depth of the grooves 12 and 22 can be set appropriately by taking reduction of the pressure loss in the groove, the relation with the thickness of the frame body, and the like into consideration, the depth of the groove may be from 10 μm to 1.0 mm, for example, and preferably from 50 μm to 700 μm, and more preferably, from 100 μm to 600 μm, and particularly preferably, from 200 μm to 500 μm.

Moreover, although the width of the through-holes 14A, 14B, 24A, and 24B can be set appropriately by taking reduction of the pressure loss in the through-hole, the relation with the thickness of the frame body, and the like into consideration, the width of the through-hole may be set from 10 μm to 1.0 mm, for example, and preferably, from 50 μm to 700 μm, and more preferably, from 100 μm to 600 μm, and particularly preferably, from 200 μm to 500 μm.

Moreover, although the length of the through-holes 14A, 14B, 24A, and 24B can be set appropriately by taking reduction of the pressure loss in the through-hole, and the like into consideration, the length of the through-hole may be from 0.5 mm to 10 mm, for example, and preferably, from 0.7 mm to 5.0 mm, and more preferably, from 1.0 mm to 2.0 mm.

Here, the width of the through-hole means a channel width of a channel formed of the through-hole and the length of the through-hole means a channel length of a channel formed of the through-hole.

A material of the frame body 100 (the pellicle frame) is not particularly limited, and a general material used for the pellicle frame may be used.

Specific examples of the material of the frame body 100 include aluminum, aluminum alloys (5000-series, 6000-series, 7000-series, and the like), stainless steel, silicon, silicon alloys, iron, iron-based alloys, carbon steel, tool steel, ceramics, metal-ceramics composite materials, resins, and the like. Among these materials, aluminum and aluminum alloys are more preferable from its light weight and strong rigidity.

Moreover, a protective film may be formed on the surface of the frame body 100.

A protective film which has resistance against hydrogen radicals present in exposure environment and EUV light or the like is preferred as the protective film.

An oxide film is an example of the protective film.

The oxide film can be formed by a known method such as anodic oxidation or the like.

Moreover, the oxide film may be colored with a black dye. When the frame body 100 has an oxide film colored with a black dye, it becomes easier to detect foreign particles on the frame body 100.

As for the other configuration of the frame body 100, the configuration of the known pellicle frame disclosed in JP-A No. 2014-021217, JP-A No. 2010-146027, and the like can be referenced.

[Variation of Pellicle Frame]

Hereinafter, a variation of the pellicle frame according to an example of the present embodiment will be described.

Although the frame body 100 has the groove formed in both the one end surface 10 and the other end surface 20, the groove in the other end surface 20 may be omitted.

Figure 4:
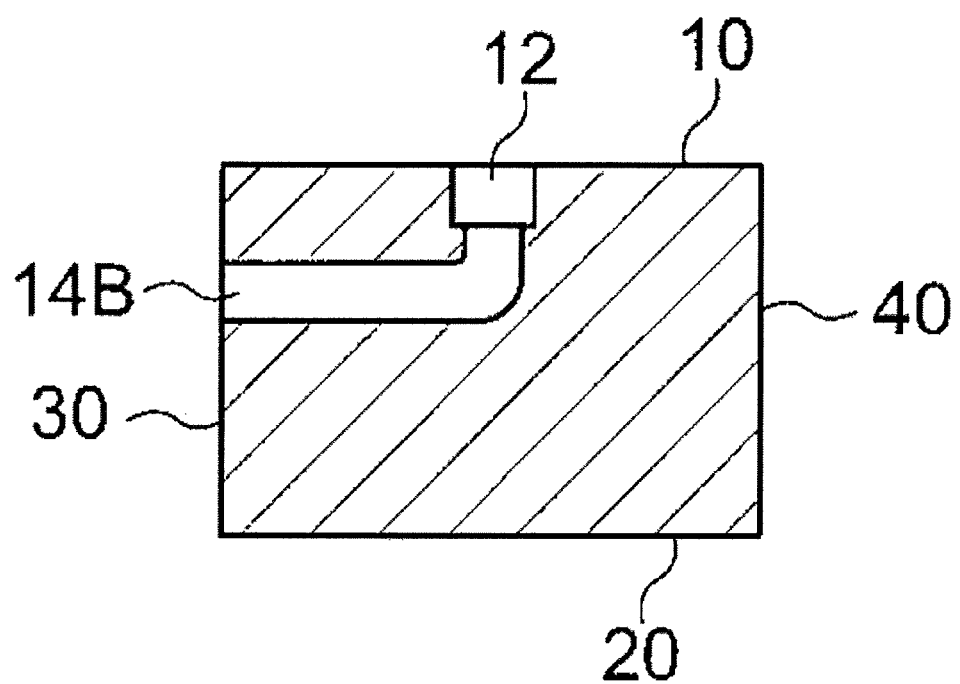
FIG. 4 is a partial cross-sectional view of a pellicle frame (frame body) according to a variation of the present embodiment.

FIG. 4 is a partial cross-sectional view of a pellicle frame (frame body) according to a variation of the present embodiment and corresponds to the partial cross-sectional view of FIG. 3.

The frame body illustrated in FIG. 4 is an example in which a groove (the groove 12) is formed in the one end surface 10 only.

Moreover, in the frame body 100 illustrated in FIGS. 1 to 3, although the shape of the grooves 12 and 22 has an endless shape that circles across the four sides of the frame body 100 when seen from the thickness direction of the frame body 100, the shape of the groove is not limited to this aspect but may have a closed-end shape.

Figure 5:
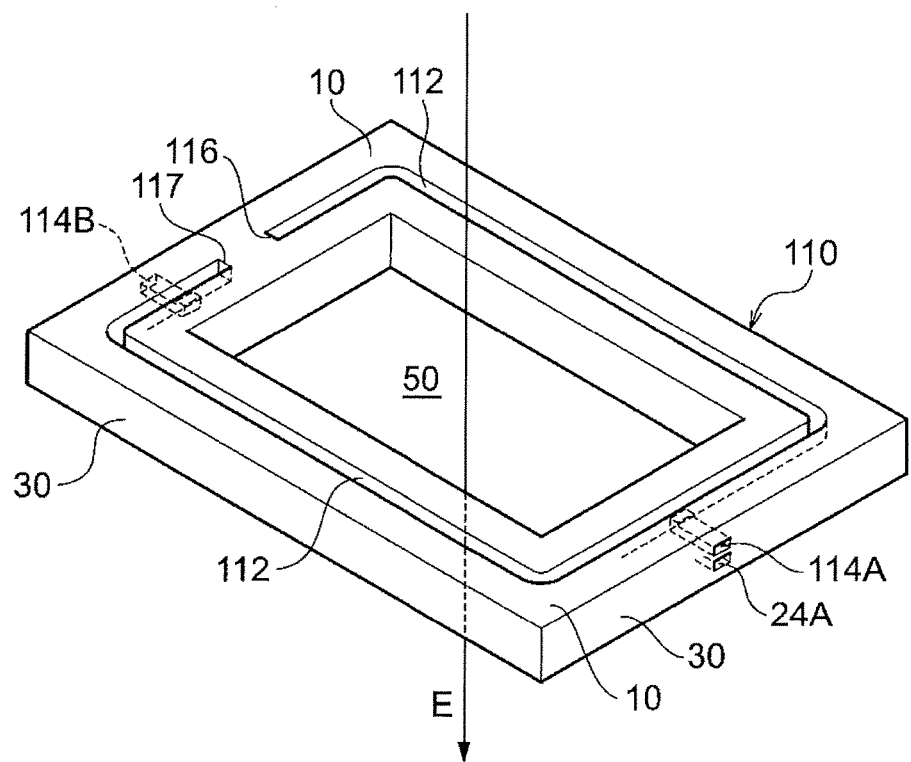
FIG. 5 is a schematic perspective view of the pellicle frame (frame body) according to the variation of the present embodiment.

FIG. 5 is a perspective view schematically illustrating a frame body 110 according to a variation of the present embodiment, in which the groove has a closed-end shape.

As illustrated in FIG. 5, a groove 112 is formed in the one end surface 10 of the frame body 110. Although the shape of the groove 112 when seen from the thickness direction of the frame body has such a shape that substantially circles across the four sides of the frame body 110, the shape does not circle completely but has a closed-end shape having ends 116 and 117.

Through-holes 114A and 114B that penetrate through a portion between the outer circumferential surface 30 and the bottom surface of the groove 112, respectively, are formed in the frame body 110.

Although not depicted in FIG. 5, a groove is formed in the other end surface of the frame body 110 similarly to the other end surface 20 of the frame body 100, and a through-hole that penetrates through a portion between the outer circumferential surface and the wall surface of the groove on the side of the other end surface is also formed.

The other configuration of the frame body 110 is the same as the configuration of the frame body 100.

Moreover, in the frame body 100 illustrated in FIGS. 1 to 3, although one groove is formed in one end surface, in the present embodiment, two or more grooves may be formed in one end surface. When two or more grooves are formed in one end surface, the through-hole is preferably connected to each of the two or more grooves (see FIGS. 6 and 7).

Moreover, when the frame body has a rectangular shape, the groove is preferably present on the four sides of the frame body so that pressing force can be applied more effectively between the frame body and the other member.

Figure 6:
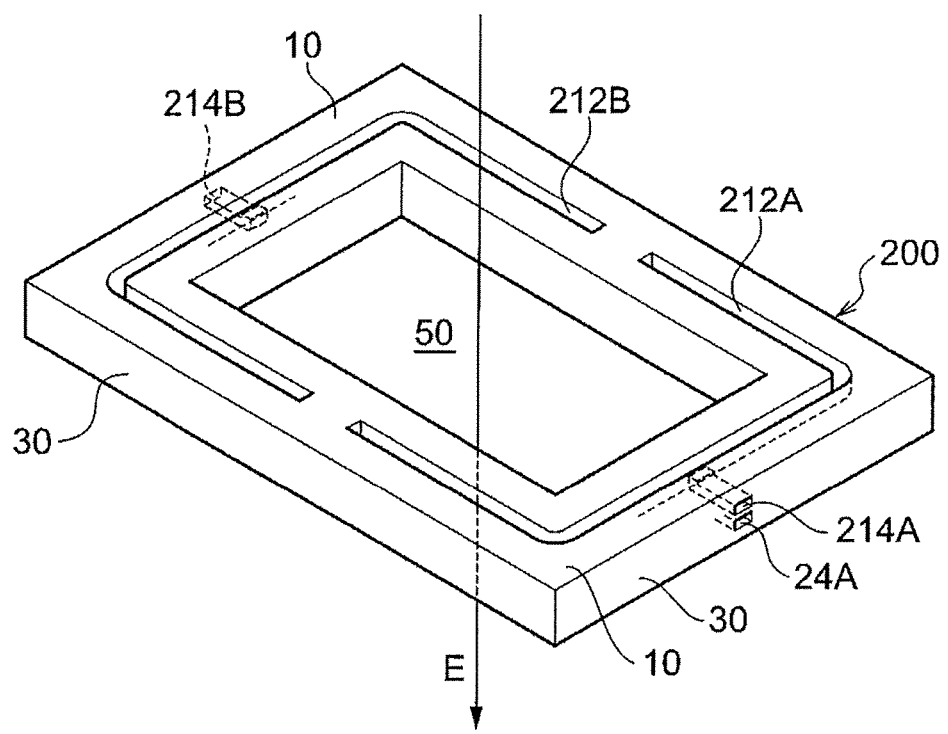
FIG. 6 is a schematic perspective view of the pellicle frame (frame body) according to the variation of the present embodiment.

Here, an example of the aspect in which "the groove is present on the four sides of the frame body" includes:

an aspect in which one groove is formed across the four sides of the frame body (for example, see FIGS. 1, 2, and 5);

an aspect in which one or more grooves are formed in each of the four sides of the frame body (for example, see FIG. 7); and an aspect in which two grooves are formed in each of the three sides of the frame body and two grooves are formed across the four sides (for example, see FIG. 6).

FIG. 6 is a perspective view schematically illustrating a frame body 200 according to a variation of the present embodiment.

As illustrated in FIG. 6, two grooves, that is, grooves 212A and 212B, are formed in the one end surface 10 of the frame body 200. Through-holes 214A and 214B that penetrate through a portion between the outer circumferential surface 30 and the bottom surfaces of the grooves 212A and 212B, respectively, are formed in the frame body 200.

Although not depicted in FIG. 6, a groove is forming in the other end surface of the frame body 200 similarly to the other end surface 20 of the frame body 100, and a through-hole that penetrates through a portion between the outer circumferential surface and the wall surface of the groove on the side of the other end surface is also formed.

The other configuration of the frame body 200 is the same as the configuration of the frame body 100, and the preferred ranges of the frame body 200 are also the same as those of the frame body 100.

Figure 7:
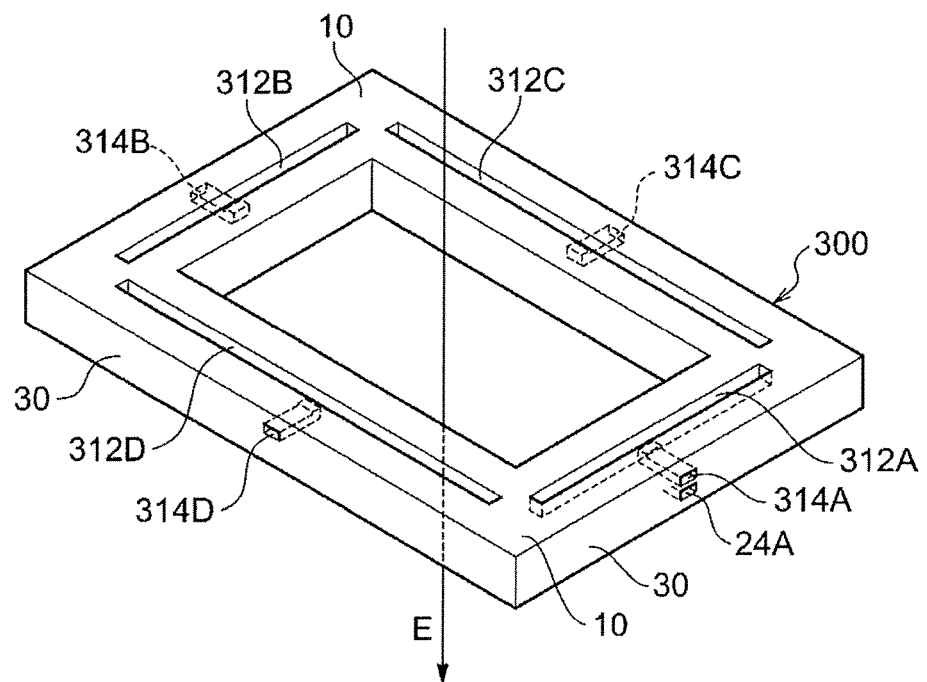
FIG. 7 is a schematic perspective view of the pellicle frame (frame body) according to the variation of the present embodiment.

FIG. 7 is a perspective view schematically illustrating a frame body 300 according to a variation of the present embodiment.

As illustrated in FIG. 7, four grooves, that is, grooves 312A, 312B, 312C, and 312D, are formed in the one end surface 10 of the frame body 300. Through-holes 314A, 314B, 314C, and 314D that penetrate through a portion between the outer circumferential surface 30 and the base surfaces of the grooves 312A, 312B, 312C, and 312D, respectively, are formed in the frame body 300.

Although not depicted in FIG. 7, a groove is formed in the other end surface of the frame body 300 similarly to the other end surface 20 of the frame body 100, and a through-hole that penetrates through a portion between the outer circumferential surface and the wall surface of the groove on the side of the other end surface is also formed.

The other configuration of the frame body 300 is the same as the configuration of the frame body 100, and the preferred ranges of the frame body 300 are also the same as those of the frame body 100.

The above-described variations may be combined appropriately.

Moreover, the shape of the groove 22 present in the other end surface 20 of each of the frame bodies 100, 110, 200, and 300 may be changed to the shape of the groove on the side of the one end surface 10 illustrated in FIGS. 5 to 7.

(Other Members)

The pellicle frame of the present embodiment may include members other than the frame body.

For example, the pellicle frame of the present embodiment may further include an adhesive layer that contacts the one end surface, in addition to the frame body. The pellicle frame of the present embodiment may further include an adhesive layer that contacts the other end surface, in addition to the frame body.

The adhesive layer is a layer which is used for adhesion with other members (the pellicle membrane, the original plate, another pellicle frame, and the like) and includes an adhesive.

In the present embodiment, the "adhesive" means adhesives in a broad sense and the concept of "adhesive" also includes pressure-sensitive adhesives.

Examples of the adhesive include acryl resin adhesives, epoxy resin adhesives, polyimide resin adhesives, silicone resin adhesives, inorganic adhesives, double-sided pressure-sensitive adhesive tapes, silicone resin pressure-sensitive adhesives, acrylic pressure-sensitive adhesives, and polyolefin-based pressure-sensitive adhesives.

A preferred example of adhesives used for adhesion with the pellicle membrane or the other pellicle frame includes acryl resin adhesives, epoxy resin adhesives, polyimide resin adhesives, silicone resin adhesives, and inorganic adhesives.

A preferred example of adhesives used for adhesion with the original plate includes double-sided pressure-sensitive adhesive tapes, silicone resin pressure-sensitive adhesives, acrylic pressure-sensitive adhesives, and polyolefin-based pressure-sensitive adhesives.

Moreover, the pellicle frame of the present embodiment may further have a separation liner (also referred to as a separation film or a separator) disposed on the adhesive layer. A known separation liner can be used without any limitation.

<Pellicle>

The pellicle of the present embodiment includes a first pellicle frame that is the pellicle frame of the present embodiment and a pellicle membrane supported at the side of the one end surface of the frame body of the first pellicle frame.

Since the pellicle of the present embodiment includes the pellicle frame of the present embodiment, the pellicle provides the same advantages as those of the pellicle frame of the present embodiment.

Specifically, in the pellicle of the present embodiment, the groove is formed in the one end surface (the end surface on the side on which the pellicle membrane is supported) of the first pellicle frame. Thus, the pellicle of the present embodiment provides an advantage (hereinafter referred to as "Advantage 1") that the pellicle can be manufactured without making any contact with the front and rear surfaces of each of the pellicle membrane and the first pellicle frame.

Moreover, in the pellicle of the present embodiment, when the groove is formed in the other end surface of the first pellicle frame, the pellicle of the present embodiment provides an advantage (hereinafter referred to as "Advantage 2") that the original plate for exposure can be manufactured without making any contact with the front and rear surfaces of each of the pellicle and the original plate.

The material of the pellicle membrane is not particularly limited and may be an organic material, an inorganic material, or a mixed material of an organic material and an inorganic material.

An example of the organic material includes fluorine-based polymers and the like.

Examples of the inorganic material include crystalline silicon (for example, monocrystalline silicon, polycrystalline silicon, and the like), diamond-like carbon (DLC), graphite, amorphous carbon, graphene, silicon carbides, silicon nitrides, and aluminum nitrides.

The pellicle membrane may contain one kind of the above-mentioned materials and may contain two or more kinds of the above-mentioned materials.

That is, the pellicle membrane may be a pellicle membrane that contains at least one selected from the group consisting of fluorine-based polymers, crystalline silicon, diamond-like carbon, graphite, amorphous carbon, graphene, silicon carbides, silicon nitrides, and aluminum nitrides.

Among these pellicle membranes, a pellicle membrane containing at least one inorganic material selected from the group consisting of crystalline silicon, diamond-like carbon, graphite, amorphous carbon, graphene, silicon carbides, silicon nitrides, and aluminum nitrides is preferred in that such pellicle membrane has high transmittance with respect to EUV light or the like and can suppress decomposition and deformation in the event of irradiation of EUV light or the like.

On the other hand, the pellicle membrane containing such inorganic materials is a membrane which is extremely easily broken and causes scratches and generates particles with contact. However, according to the present embodiment, since the pellicle can be manufactured without making any contact with the front and rear surfaces of each of the pellicle membrane and the first pellicle frame, it is possible to effectively prevent destruction, scratches, particle generation, or the like of the pellicle membrane, caused by contact even when the pellicle membrane containing such inorganic materials is used.

Moreover, the configuration of the pellicle membrane may be such that the pellicle membrane may have a single layer and may have two or more layers.

The thickness (the total thickness when the pellicle membrane includes two or more layers) of the pellicle membrane may be from 10 nm to 200 nm, for example, and preferably, from 10 nm to 100 nm, and more preferably, from 10 nm to 70 nm, and particularly preferably, from 10 nm to 50 nm.

When the pellicle membrane is thin (for example, 200 nm or smaller), the pellicle membrane has excellent transmittance with respect to EUV light or the like.

On the other hand, when the pellicle membrane is thin (for example, 200 nm or smaller), the pellicle membrane tends to be easily broken. However, according to the present embodiment, since the pellicle can be manufactured without making any contact with the front and rear surfaces of each of the pellicle membrane and the first pellicle frame, it is possible to effectively prevent destruction of the pellicle membrane even when a thin pellicle membrane (for example, 200 nm or smaller) is used.

According to a preferred aspect of the pellicle of the present embodiment, a second pellicle frame that contacts the pellicle membrane is disposed between the pellicle membrane and the first pellicle frame.

This aspect provides an advantage that it is possible to manufacture the pellicle while maintaining the membrane shape of the pellicle membrane with the aid of the second pellicle frame even when the pellicle membrane is a membrane that is rarely self-supporting (for example, a pellicle membrane containing an inorganic material such as a crystalline silicon film, a thin pellicle membrane, or the like).

The pellicle of the aspect, having the second pellicle frame preferably has a composite member, the composite member including the pellicle membrane and the second pellicle frame.

The pellicle of the aspect, having the second pellicle frame is manufactured suitably by fixing the first pellicle frame and the composite member.

An example of the composite member includes a composite member including a crystalline silicon film as the pellicle membrane and a frame-shaped silicon substrate (for example, a silicon wafer) as the second pellicle frame. In manufacturing of the pellicle, when the composite member according to this example is used, the pellicle can be manufactured while maintaining the membrane shape of the pellicle membrane (the crystalline silicon film) with the aid of the second pellicle frame (the frame-shaped silicon substrate).

The composite member according to this example can be manufactured, for example, by, first, forming a crystalline silicon film on a silicon substrate, and subsequently, etching a central portion of the silicon substrate from the side of the silicon substrate on which the crystalline silicon film is not formed, to remove the silicon substrate in the central portion. The crystalline silicon film only remains in the central portion of the composite member manufactured by this method and the crystalline silicon film in the central portion forms the pellicle membrane. The crystalline silicon film and the silicon substrate remain in the peripheral portion around the central portion and the silicon substrate remaining in the peripheral portion forms the second pellicle frame. When a circular silicon substrate (for example, a silicon wafer) is used as the silicon substrate, the circular silicon substrate and the crystalline silicon film are preferably cut in the same outer shape as the outer shape of the first pellicle frame before or after the silicon substrate and the crystalline silicon film are bonded to the first pellicle frame. This cutting operation is referred to as "trimming".

When the composite member of the pellicle membrane and the second pellicle frame is a composite member other than the example, the composite member can be manufactured according to the same method.

(Example of Pellicle)

Next, an example of the pellicle of the present embodiment will be described with reference to FIG. 8. However, the pellicle of the present embodiment is not limited to this example.

Figure 8:
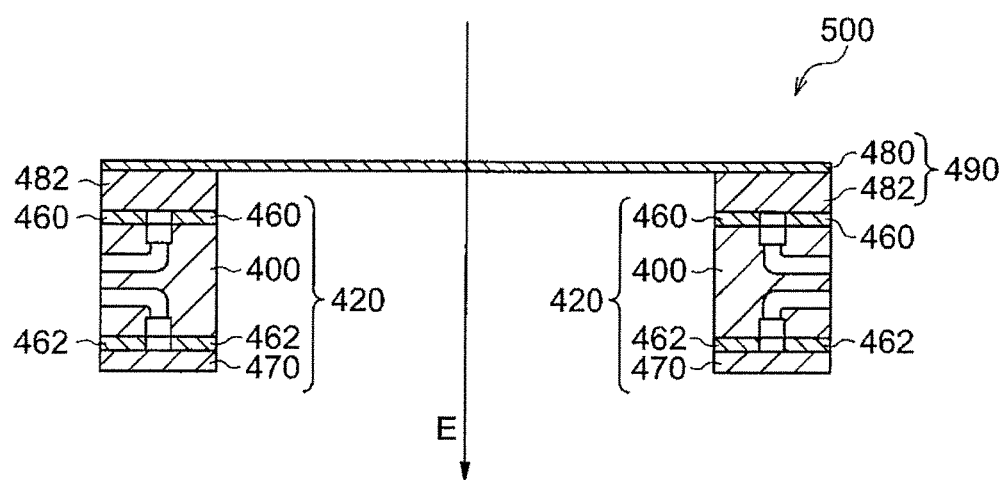
FIG. 8 is a schematic cross-sectional view of a pellicle according to an example of the present embodiment.

FIG. 8 is a schematic cross-sectional view of an example (pellicle 500) of the pellicle of the present embodiment.

As illustrated in FIG. 8, the pellicle 500 has such a configuration in which a composite member 490 including a pellicle membrane 480 and a second pellicle frame 482 is bonded to a first pellicle frame 420.

The first pellicle frame 420 includes a frame body 400, an adhesive layer 460 that contacts one end surface of the frame body 400, an adhesive layer 462 that contacts the other end surface of the frame body 400, and a separation liner 470 that contacts the adhesive layer 462.

The frame body 400 has the grooves in the same manner as the frame body 100 described above, formed in both the one end surface and the other end surface in the thickness direction. Further, the frame body 400 has the through-holes in the same manner as the frame body 100.

The one end surface of the first pellicle frame 420 is an end surface corresponding to the one end surface 10 of the frame body 100 described above, and the other end surface of the first pellicle frame 420 is an end surface corresponding to the other end surface 20 of the frame body 100 described above.

In the pellicle 500, the composite member 490 and the first pellicle frame 420 are disposed so that the second pellicle frame 482 of the composite member 490 contacts the adhesive layer 460 of the first pellicle frame 420.

That is, the pellicle 500 includes the first pellicle frame 420 having the frame body 400 and the pellicle membrane 480 supported on the side of the one end surface of the frame body 400 of the first pellicle frame 420. Moreover, the pellicle 500 has the second pellicle frame 482 disposed between the first pellicle frame 420 and the pellicle membrane 480 so as to contacts the pellicle membrane 480.

The pellicle 500 is preferably manufactured by fixing (bonding) the composite member 490 and the first pellicle frame 420 to each other.

In this case, since the inside of the groove forming in the one end surface of the frame body 400 can be reducing pressure through the through-hole connected to the groove, it is possible to fix the composite member 490 and the first pellicle frame 420 without making any contact with the front and rear surfaces of each of the composite member 490 and the first pellicle frame 420.

The separation liner 470 of the first pellicle frame 420 is provided to protect the exposed surface of the adhesive layer 462.

When the original plate for exposure is manufactured using the pellicle 500, first, the separation liner 470 is removed from the first pellicle frame 420 of the pellicle 500 to expose the adhesive layer 462, and subsequently, the pellicle and the original plate are fixed by the exposed adhesive layer 462.

A composite member including the pellicle membrane 480 which is a polycrystalline silicon film (p-Si film) and the second pellicle frame 482 which is a silicon substrate is preferred as the composite member 490. Such a composite member can be manufactured by the same method as described above.

A frame member formed of aluminum or aluminum alloys is preferred as the frame body 400.

Moreover, a preferred example of the adhesive included in the adhesive layer 460 includes acryl resin adhesives, epoxy resin adhesives, polyimide resin adhesives, silicone resin adhesives, and inorganic adhesives.

Moreover, a preferred example of the adhesive included in the adhesive layer 462 includes double-sided pressure-sensitive adhesive tapes, silicone resin pressure-sensitive adhesives, acrylic pressure-sensitive adhesives, and polyolefin-based pressure-sensitive adhesives.

<Method of Manufacturing Pellicle>

A method of manufacturing the pellicle of the present embodiment includes an arrangement process of arranging the pellicle frame of the present embodiment and the pellicle membrane such that the one end surface of the frame body and the pellicle membrane face each other; and a fixing process of fixing the pellicle frame and the pellicle membrane by reducing pressure inside the groove formed in the one end surface through the through-hole that penetrates through the portion between the outer circumferential surface and the wall surface of the groove formed in the one end surface.

According to the method of manufacturing the pellicle of the present embodiment, as described above, since pressing force can be applied between the pellicle frame (frame body) and the pellicle membrane by reducing the pressure, it is possible to fix the pellicle frame and the pellicle membrane without making any contact with the front and rear surfaces of each of the pellicle frame and the pellicle membrane.

In the method of manufacturing the pellicle of the present embodiment, the reducing of the pressure in the fixing process is preferably performed in a state in which the pellicle frame and the pellicle membrane are disposed in a pressurized atmosphere.

According to this aspect, since the difference (pressure difference) between the pressure of an overall environment in which the pellicle frame and the pellicle membrane are arranged and the pressure of the inside of the groove can be increased further, it is possible to further increase the pressing force occurring between the pellicle frame and the pellicle membrane. Thus, the pellicle frame and the pellicle membrane can be fixed more easily.

The pressing force (the force applied to the entire pellicle frame) is preferably 1 N or higher and more preferably 2 N or higher.

The pressing force (the force applied to the entire pellicle frame) is more preferably 10 N or higher and particularly preferably 20 N or higher.

Although the upper limit of the pressing force (the force applied to the entire pellicle frame) is not particularly limited, the upper limit is 500 N, for example, and preferably 400 N, from the perspective of productivity or the like.

In the manufacturing method, when the pellicle (for example, the pellicle 500) having the second pellicle frame is manufactured, the arrangement process may be a process of arranging the first pellicle frame which is the pellicle frame of the present embodiment and the composite member (a composite member including the pellicle membrane and the second pellicle frame) so that the one end surface of the frame body of the first pellicle frame and the pellicle membrane with the second pellicle frame interposed faces each other.

In this case, the method of manufacturing the pellicle includes an arrangement process of arranging the first pellicle frame which is the pellicle frame of the present embodiment and the composite member which includes the pellicle membrane and the second pellicle frame, the second pellicle frame contacts the pellicle membrane, such that the one end surface of the frame body of the first pellicle frame and the second pellicle frame of the composite member faces each other, and a fixing process of fixing the first pellicle frame and the pellicle membrane with the aid of the second pellicle frame by reducing pressure inside the groove through the through-hole.

<Original Plate for Exposure>

The original plate for exposure of the present embodiment includes the pellicle of the present embodiment and the original plate disposed on the side of the first pellicle frame of the pellicle.

Since the original plate for exposure of the present embodiment includes the pellicle of the present embodiment, the original plate for exposure provides the same advantages as those of the pellicle of the present embodiment.

In the original plate for exposure of the present embodiment, the frame body of the first pellicle frame preferably further has a groove formed in the other end surface of the frame body, the other end surface is in the thickness direction, and a through-hole that penetrates through a portion between the outer circumferential surface and a wall surface of the groove formed in the other end surface. The original plate for exposure of this aspect can be manufactured without making any contact with the front and rear surfaces of each of the pellicle and the original plate.

Here, an original plate including a supporting substrate, a reflective layer layered on the supporting substrate, and an absorbent layer formed on the reflective layer can be used as the original plate. The absorbent layer partially absorbs the EUV light or the like whereby a desired image is formed on a sensitive substrate (for example, a semiconductor substrate with photoresist). The reflective layer may be a multilayer film of molybdenum (Mo) and silicon (Si). The absorbent layer may be a material having high absorbability with respect to EUV light or the like, such as chrome (Cr) or tantalum nitride.

<Method of Manufacturing Original Plate for Exposure>

The original plate for exposure manufacturing method of the present embodiment includes an arrangement process of arranging the pellicle of the present embodiment and the original plate, in which the frame body of the first pellicle frame further has a groove formed in the other end surface in the thickness direction of the frame body, and a through-hole that penetrates through a portion between the outer circumferential surface and the wall surface of the groove formed in the other end surface, and the arranging is performed such that the other end surface and the original plate face each other; and a fixing process of fixing the pellicle and the original plate by reducing pressure inside the groove formed in the other end surface through the through-hole that penetrates through a portion between the outer circumferential surface and the wall surface of the groove formed in the other end surface.

According to the method of manufacturing the original plate for exposure of the present embodiment, since pressing force can be applied between the pellicle and the original plate by reducing pressure inside the groove, it is possible to fix the pellicle and the original plate without making any contact with the front and rear surfaces of each of the pellicle and the original plate.

In the method of manufacturing the original plate for exposure, the reducing of the pressure in the fixing process is preferably performed in a state in which the pellicle and the original plate are disposed in a pressurized atmosphere.

According to this aspect, since the difference (pressure difference) between the pressure of an overall environment in which the pellicle and the original plate are arranged and the pressure of the inside of the groove can be increased further, it is possible to further increase the pressing force occurring between the pellicle and the original plate. Thus, the pellicle and the original plate can be fixed more easily.

The pressing force (the force applied to the entire pellicle frame) applied between the pellicle and the original plate is preferably 1 N or higher and more preferably 2 N or higher.

The pressing force (the force applied to the entire pellicle frame) applied between the pellicle and the original plate is preferably 10 N or higher and particularly preferably 20 N or higher.

Although the upper limit of the pressing force (the force applied to the entire pellicle frame) applied between the pellicle and the original plate is not particularly limited, the upper limit is 500 N, for example, and preferably 400 N, from the perspective of productivity or the like.

<Exposure Device>

An exposure device of the present embodiment includes the original plate for exposure of the present embodiment.

Thus, the exposure device provides the same advantages as those of the original plate for exposure of the present embodiment.

The exposure device of the present embodiment includes a light source configured to emit exposure light (preferably, EUV light or the like, and more preferably, EUV light, the same hereinbelow), the original plate for exposure of the present embodiment, and an optical system configured to guide the exposure light emitted from the light source toward the original plate for exposure, in which the original plate for exposure is preferably disposed such that the exposure light emitted from the light source passes through the pellicle membrane to irradiate the original plate.

According to this aspect, it is possible to form fine patterns (for example, with a line width of 32 nm or smaller) using EUV light or the like. Moreover, even when EUV light or the like which may cause the problem of resolution defects caused by foreign particles is used as the exposure light, it is possible to form exposure patterns in which resolution defects caused by foreign particles are suppressed.

<Method of Manufacturing Semiconductor Device>

A method of manufacturing a semiconductor device of the present embodiment includes a step of allowing exposure light emitted from a light source to pass through the pellicle membrane of the original plate for exposure of the present embodiment, irradiate the original plate and be reflected from the original plate, and a step of allowing the exposure light reflected from the original plate to pass through the pellicle membrane and irradiate a sensitive substrate, thereby exposing the sensitive substrate in a pattern.

According to the method of manufacturing the semiconductor device of the present embodiment, even when EUV light or the like which may cause the problem of resolution defects caused by foreign particles is used as exposure light, it is possible to manufacture a semiconductor device in which resolution defects caused by foreign particles are suppressed.

Figure 9:
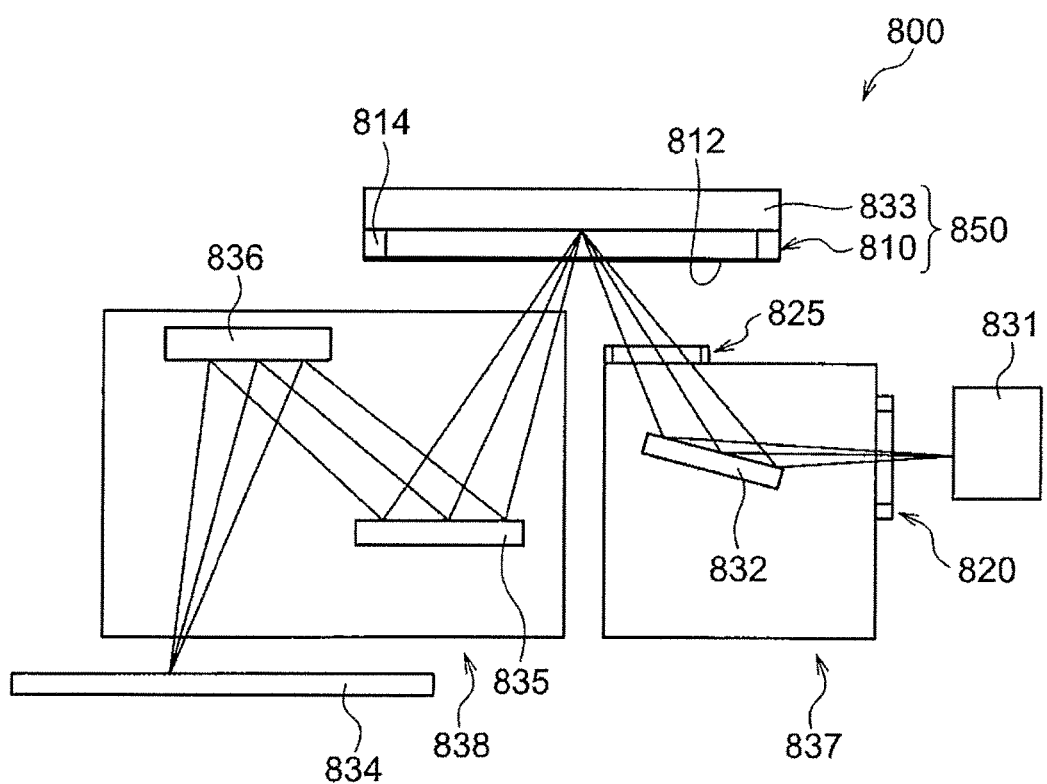
FIG. 9 is a schematic cross-sectional view of a EUV exposure device according to an example of an exposure device of the present embodiment.

FIG. 9 is a schematic cross-sectional view of a EUV exposure device 800 which is an example of the exposure device of the present embodiment.

As illustrated in FIG. 9, the EUV exposure device 800 includes a light source 831 that emits EUV light, an original plate for exposure 850 which is an example of the original plate for exposure of the present embodiment, and an illumination optical system 837 that guides the EUV light emitted from the light source 831 to the original plate for exposure 850.

The original plate for exposure 850 includes a pellicle 810 including a pellicle membrane 812 and a pellicle frame 814 and an original plate 833. The original plate for exposure 850 is disposed so that the EUV light emitted from the light source 831 passes through the pellicle membrane 812 and irradiate the original plate 833.

The original plate 833 is configured to reflect the irradiated EUV light in a pattern.

The pellicle frame 814 and the pellicle 810 are examples of the pellicle frame and the pellicle of the present embodiment, respectively.

In the EUV exposure device 800, filter windows 820 and 825 are provided between the light source 831 and the illumination optical system 837 and between the illumination optical system 837 and the original plate 833, respectively.

Moreover, the EUV exposure device 800 includes a projection optical system 838 that guides the EUV light reflected from the original plate 833 to the sensitive substrate 834.

In the EUV exposure device 800, the EUV light reflected from the original plate 833 is guided to the sensitive substrate 834 through the projection optical system 838 and the sensitive substrate 834 is exposed in a pattern. The EUV exposure is performed under the condition of reduced pressure.

The EUV light source 831 emits EUV light toward the illumination optical system 837.

The EUV light source 831 includes a target material, a pulse laser irradiation unit, and the like. A pulse laser is irradiated on the target material to generate plasma, to thereby obtain EUV. When Xe is used as the target material, EUV having a wavelength of 13 nm to 14 nm is obtained. The wavelength of the light emitted by the EUV light source is not limited to 13 nm to 14 nm, and may be any suitable wavelength selected from the range of 5 nm to 30 nm.

The illumination optical system 837 condenses light emitted from the EUV light source 831, equalizes illuminance, and irradiates the original plate 833.

The illumination optical system 837 includes a plurality of multilayer film mirrors 832 for adjusting the optical path of the EUV, an optical coupler (optical integrator), and the like. The multilayer film mirror is a multilayer film in which molybdenum (Mo) and silicon (Si) are layered each other alternately.

A method of attaching the filter windows 820 and 825 is not particularly limited. For example, the filter window may be attached using an adhesive or the like and may be fixed mechanically into the EUV exposure device.

The filter window 820 disposed between the light source 831 and the illumination optical system 837 captures scattering particles (debris) generated from the light source so that the scattering particles (debris) do not adhere to an element (for example, the multilayer film mirror 832) inside the illumination optical system 837.

On the other hand, the filter window 825 disposed between the illumination optical system 837 and the original plate 833 captures particles (debris) scattering from the light source 831 so that the scattering particles (debris) do not adhere to the original plate 833.

Moreover, since foreign particles adhering to the original plate absorb or scatter EUV light, the foreign particles cause resolution defects on a wafer. Thus, the pellicle 810 is attached so as to cover a EUV irradiation area of the original plate 833. The EUV light passes through the pellicle membrane 812 and irradiate the original plate 833.

The EUV light reflected from the original plate 833 passes through the pellicle membrane 812 and irradiate the sensitive substrate 834 through the projection optical system 838.

The projection optical system 838 condenses light reflected from the original plate 833 to irradiate the sensitive substrate 834. A plurality of multilayer film mirrors 835, 836, and the like for adjusting the optical path of the EUV is included in the projection optical system 838.

The sensitive substrate 834 is a substrate in which a resist is applied on a semiconductor wafer, and the resist is exposed in a pattern form by the EUV reflected from the original plate 833. The resist is developed and the semiconductor wafer is etched, whereby a desired pattern is formed on the semiconductor wafer.

The disclosure of Japanese Patent Application No. 2014-095425, filed on May 2, 2014 is incorporated in its entirety by reference in the present specification.

All publications, patent applications, and technical standards mentioned in the present specification are herein incorporated by reference to the same extent as if each individual publication, patent application, or technical standard was specifically and individually indicated to be incorporated by reference.

The invention claimed is:

1. A pellicle frame comprising a frame body, the frame body having
   a groove formed in one end surface of the frame body, the one end surface being an end surface in a thickness direction of the frame body that is located at a side configured to support a pellicle membrane, and
   a through-hole that penetrates through a portion between an outer circumferential surface of the frame body and a wall surface of the groove formed in the one end surface,
   wherein the frame body does not have a through-hole that penetrates through a portion between an inner circumferential surface and the wall surface of the groove formed in the one end surface.

2. The pellicle frame according to claim 1, wherein
   the frame body further has a groove formed in the other end surface in the thickness direction of the frame body, and a through-hole that penetrates through a portion between the outer circumferential surface and a wall surface of the groove formed in the other end surface.

3. The pellicle frame according to claim 1, further comprising an adhesive layer that contacts the one end surface.

4. A pellicle comprising:
a first pellicle frame that is the pellicle frame according to claim 1; and
a pellicle membrane supported at a side of the frame body of the first pellicle frame at which the one end surface is located.

5. The pellicle according to claim 4, wherein the pellicle membrane comprises at least one inorganic material selected from the group consisting of crystalline silicon, diamond-like carbon, graphite, amorphous carbon, graphene, silicon carbides, silicon nitrides, and aluminum nitrides.

6. The pellicle according to claim 4, wherein the pellicle membrane has a thickness of from 10 nm to 200 nm.

7. The pellicle according to claim 4, further comprising a second pellicle frame that contacts the pellicle membrane, the second pellicle frame being provided between the first pellicle frame and the pellicle membrane.

8. The pellicle according to claim 7, wherein the pellicle comprises a composite member, the composite member including a crystalline silicon film as the pellicle membrane and a frame-shaped silicon substrate as the second pellicle frame.

9. A method of manufacturing a pellicle, comprising:
an arrangement process of arranging the pellicle frame according to claim 1 and a pellicle membrane such that the one end surface of the frame body and the pellicle membrane face each other; and
a fixing process of fixing the pellicle frame and the pellicle membrane by reducing pressure inside the groove formed in the one end surface through the through-hole that penetrates through the portion between the outer circumferential surface and the wall surface of the groove formed in the one end surface.

10. The method of manufacturing a pellicle according to claim 9, wherein in the fixing process, the reducing of the pressure is performed in a state in which the pellicle frame and the pellicle membrane are disposed in a pressurized atmosphere.

11. An original plate for exposure, comprising:
the pellicle according to claim 4; and
an original plate disposed on a first pellicle frame side of the pellicle.

12. The original plate for exposure according to claim 11, wherein the frame body of the first pellicle frame further has a groove formed in the other end surface of the frame body, the other end surface being in the thickness direction, and a through-hole that penetrates through a portion between the outer circumferential surface and a wall surface of the groove formed in the other end surface.

13. A method of manufacturing an original plate for exposure, comprising:
an arrangement process of arranging the pellicle according to claim 4 and an original plate, and the arranging is performed such that the other end surface and the original plate face each other, and
a fixing process of fixing the pellicle and the original plate by reducing pressure inside the groove formed in the other end surface through the through-hole that penetrates through the portion between the outer circumferential surface and the wall surface of the groove formed in the other end surface.

14. The method of manufacturing an original plate for exposure according to claim 13, wherein the reducing of pressure in the fixing process is performed in a state in which the pellicle and the original plate are disposed in a pressurized atmosphere.

15. An exposure device comprising the original plate for exposure according to claim 11.

16. An exposure device comprising:
a light source configured to emit exposure light;
the original plate for exposure according to claim 11; and
an optical system configured to guide the exposure light emitted from the light source toward the original plate for exposure, wherein
the original plate for exposure is disposed such that the exposure light emitted from the light source passes through the pellicle membrane to irradiate the original plate.

17. The exposure device according to claim 16, wherein the exposure light is EUV light.

18. A method of manufacturing a semiconductor device, comprising:
a step of allowing exposure light emitted from a light source to pass through the pellicle membrane of the original plate for exposure according to claim 11, irradiate the original plate and be reflected from the original plate; and
a step of allowing the exposure light reflected from the original plate to pass through the pellicle membrane and irradiate a sensitive substrate, thereby exposing the sensitive substrate in a pattern.

19. The method of manufacturing a semiconductor device according to claim 18, wherein the exposure light is EUV light.

20. The pellicle frame according to claim 1, wherein the through-hole, that penetrates through the portion between the outer circumferential surface of the frame body and the wall surface of the groove formed in the one end surface, penetrates through the portion between the outer circumferential surface of the frame body and the bottom surface of the groove.

21. The pellicle according to claim 5, wherein the through-hole, that penetrates through the portion between the outer circumferential surface of the frame body and the wall surface of the groove formed in the one end surface, penetrates through the portion between the outer circumferential surface of the frame body and the bottom surface of the groove.

* * * * *